(12) United States Patent
Risch et al.

(10) Patent No.: US 8,485,774 B2
(45) Date of Patent: Jul. 16, 2013

(54) APPARATUS FOR MANUFACTURING SOLAR CELLS AND PROCESS FOR OPERATING SUCH APPARATUS

(75) Inventors: Wolfgang Risch, Umkirch (DE); Bernd Hirzler, Endingen (DE); Martin Schultis, Waldkirch (DE); Gerhard Knoll, Umkirch (DE)

(73) Assignee: Somont GmbH, Umkirch (DE)

( * ) Notice: Subject to any disclaimer, the term of this patent is extended or adjusted under 35 U.S.C. 154(b) by 0 days.

(21) Appl. No.: 13/395,870

(22) PCT Filed: Sep. 15, 2010

(86) PCT No.: PCT/IB2010/054159
§ 371 (c)(1), (2), (4) Date: Mar. 13, 2012

(87) PCT Pub. No.: WO2011/033458
PCT Pub. Date: Mar. 24, 2011

(65) Prior Publication Data
US 2012/0171786 A1    Jul. 5, 2012

(30) Foreign Application Priority Data
Sep. 16, 2009 (EP) .................... 09011797

(51) Int. Cl.
*B65G 57/00* (2006.01)
*B31B 19/98* (2006.01)
*H01L 22/20* (2006.01)
*B82Y 20/00* (2011.01)
*Y02E 10/50* (2006.01)

(52) U.S. Cl.
USPC ............ 414/788; 438/5; 438/14; 438/22; 414/27; 136/290

(58) Field of Classification Search
USPC ............... 438/48–99, 14–18; 136/243–244; 414/788–798.9
See application file for complete search history.

(56) References Cited

U.S. PATENT DOCUMENTS
6,966,184 B2 * 11/2005 Toyomura et al. ........... 60/641.8
(Continued)

FOREIGN PATENT DOCUMENTS
EP  2299502 A1   3/2011
WO  96/17387 A1  6/1996
WO  03/098704 A1 11/2003

OTHER PUBLICATIONS
PCT International Search Report and Written Opinion from PCT/IB2010/054159 parent application to the present application; dated Nov. 30, 2010 and Mar. 20, 2012 (in English).
(Continued)

*Primary Examiner* — Seahvosh Nikmanesh
*Assistant Examiner* — Evren Seven
(74) *Attorney, Agent, or Firm* — George Kapsalas; Patentbuero Paul Rosenich AG

(57) ABSTRACT

Apparatus (1) for manufacturing solar cell matrices includes several stringers (2) for forming strings from solar cells, a lay-up and interconnection station (5) for arranging and interconnecting the strings to form a solar cell matrix, and a transportation system (3) for transferring the strings from the stringers (2) to the lay-up and interconnection station (5), wherein the stringers (2) are arranged perpendicular to the direction of flow of the transportation system (3), or in an acute angle to an axis perpendicular to the direction of flow of the transportation system (3). Furthermore, a process for operating such apparatus (1), wherein the several stringers (2) are controlled such that collision between different strings is avoided in the transportation system (3).

19 Claims, 2 Drawing Sheets

U.S. PATENT DOCUMENTS

Figure 1:
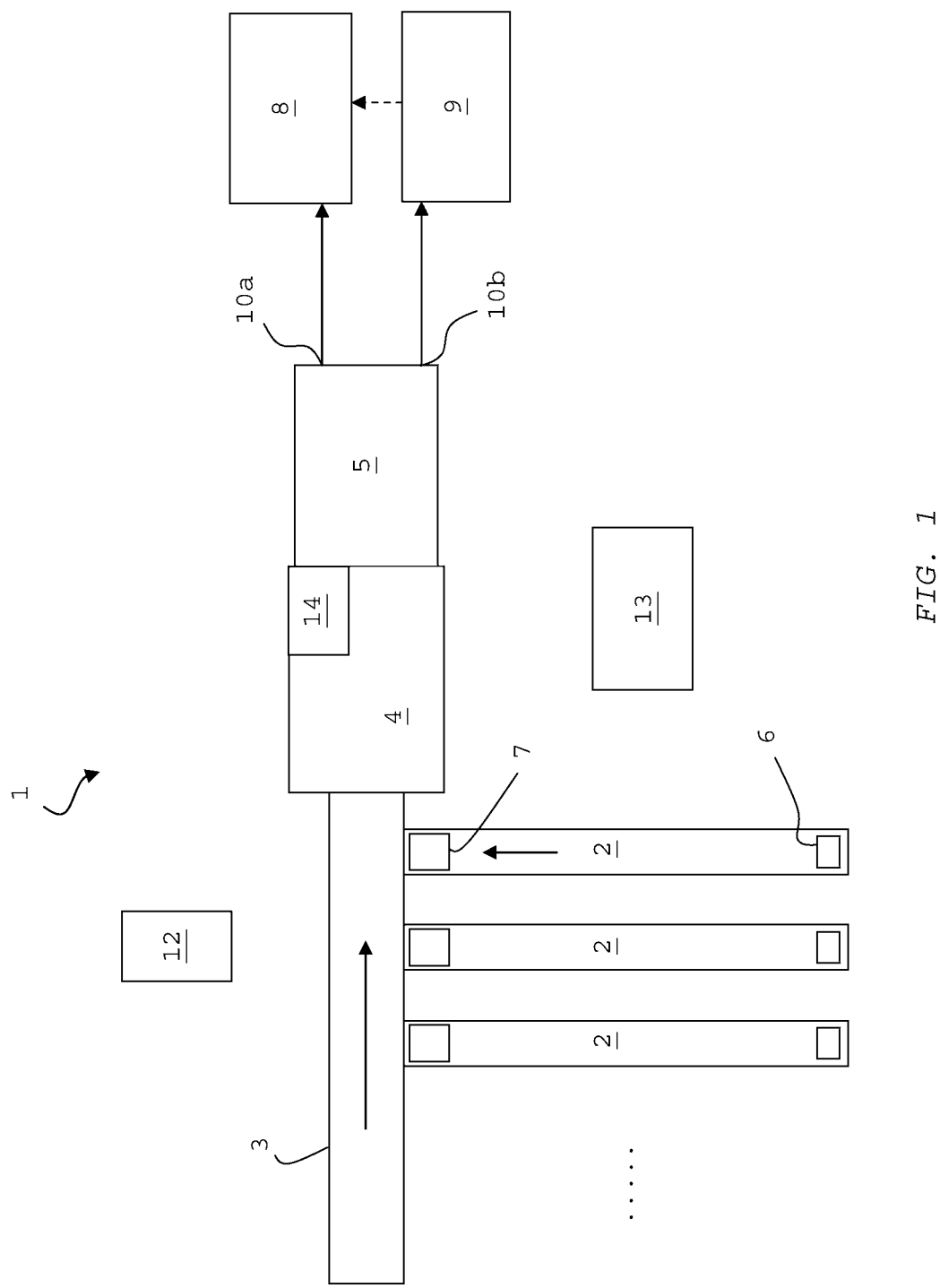

| | | | | |
|---|---|---|---|---|
| 7,642,450 | B2* | 1/2010 | Connor | 136/246 |
| 8,039,777 | B2* | 10/2011 | Lance et al. | 250/203.4 |
| 8,071,930 | B2* | 12/2011 | Wylie et al. | 250/203.4 |
| 2005/0217718 | A1* | 10/2005 | Dings et al. | 136/256 |
| 2005/0253016 | A1* | 11/2005 | Landmann | 244/1 N |
| 2010/0018562 | A1* | 1/2010 | Kurahashi et al. | 136/244 |
| 2012/0042932 | A1* | 2/2012 | Wylie et al. | 136/246 |
| 2012/0152304 | A1* | 6/2012 | Storbeck et al. | 136/244 |
| 2012/0152327 | A1* | 6/2012 | Pinarbasi et al. | 136/251 |
| 2012/0167986 | A1* | 7/2012 | Meakin et al. | 136/259 |
| 2012/0168076 | A1* | 7/2012 | Suga et al. | 156/308.2 |

OTHER PUBLICATIONS

EPO Search Report and Written Opinion, dated Feb. 23, 2010, from priority application EP09011797 (in English).

Nowlan, M., "Development of Automated Production Line Processes for Solar Brightfield Modules: Final Report," Jun. 1, 2003-Nov. 30, 2007, subcontract report Apr. 2008. National Renewable Energy Laboratories; pp. 1-9.

Nowlan, M.J. et al., "Advanced Automation Techniques for Interconnecting Thin Silicon Solar Cells," from World Conf. on Photovoltaic Energy, Waikoloa Hawaii, Dec. 5-9, 1994; vol. 1, pp. 828-831.

* cited by examiner

APPARATUS FOR MANUFACTURING SOLAR CELLS AND PROCESS FOR OPERATING SUCH APPARATUS

This application is a 35 U.S.C. 371 national-phase entry of PCT International application no. PCT/IB2010/054159 filed on Sep. 15, 2010 and published as WO2011/033458A1 on Mar. 24, 2011, which in turn claims benefit of priority to prior European application EP09011797 filed on Sep. 16, 2009; the entirety of parent PCT International application no. PCT/IB2010/54149 is hereby expressly incorporated herein by reference, in its entirety and as to all its parts, for all intents and purposes, as if set forth identically in full herein.

The invention relates to apparatus for manufacturing solar cell matrices and methods for operating such apparatus according to the disclosure herein.

In order to manufacture solar modules that may, for example, be placed on a roof of a building for solar energy generation, several solar cells (also called photovoltaic cells) with bus bars are typically connected in series with each other to form so called strings. For this, the bus bars of the solar cells are connected with the bus bars of neighboring solar cells by solder ribbons. The solder ribbons are usually made of tinned copper and are connected with the bus bars by one or more soldering units. The strings are typically formed automatically in an apparatus called stringer.

After the strings have been formed they are typically transferred from the stringer to a quality testing station for inspection of the alignment of the solar cells and the solder ribbons, as well as for the detection of possible breakage. Then the strings are transferred to a lay-up and interconnection station where they are placed sun-side down and in parallel next to each other upon an EVA (ethylene vinyl acetate) glass plate sandwich, and are interconnected to form a solar cell matrix. The solar cell matrix is then transferred to a laminator for lamination for protection purposes to form the actual solar cell module.

With existing apparatuses for manufacturing solar cell matrices the stringer is directly attached to the quality testing station such that the direction of flow within the stringer corresponds to the direction of flow within the quality testing station. Leaving the quality testing station, the strings have to be turned by 90 degrees for lay-up and transverse interconnection in the lay-up and interconnection station.

The invention provides apparatus for manufacturing solar cell matrices with increased production rate. The invention provides processes for operating such apparatus.

In order to implement these and still further objects of the invention, as shall become more readily apparent as the description proceeds, an apparatus for manufacturing solar cell matrices is provided that includes several stringers for forming strings from solar cells, in particular a quality testing station for testing the formed strings, and a lay-up and interconnection station for arranging the strings on a glass plate to form a solar cell matrix. A transportation system is provided for transferring the strings from the stringers—directly or indirectly—to the lay-up and interconnection station. For operation, the several/multiple stringers are attached to the one transportation system. During operation, the stringers thus deliver the strings that they formed to the same transportation system. The stringers are arranged perpendicular to the direction of flow of the transportation system and/or in an acute angle to an axis perpendicular to the direction of flow of the transportation system. The stringers are preferably arranged in parallel to each other. By so-arranging the stringers, raw material such as solar cells and solder ribbons may be easily applied to an input unit arranged at that transverse side of a stringer that advantageously faces away from the transportation system. During transportation in the transportation system, the longitudinal axis of the strings is perpendicular to the direction of flow of the transportation system. The provision of several stringers makes the production of solar cell matrices faster.

A quality testing station for testing the strings produced by the stringers may be provided. If the quality testing station is arranged between the transportation system and the lay-up and interconnection station, the transportation system preferably transfers the strings from the stringers directly to the quality testing station.

The direction of flow of the transportation system preferably corresponds to the direction of flow of the quality testing station and preferably also to the direction of flow of the lay-up and interconnection station. Turning of the strings by 90 degrees—as is required in known apparatuses for manufacturing solar cell matrices—can thus advantageously be avoided, which also leads to an increase in production rate.

The transportation system preferably includes holders with suction cups for transporting the strings to the quality testing station. Alternative or additional means for transportation are, however, possible, such as conveyor belts that are constructed and arranged such that they cannot damage the transported strings.

The apparatus of the invention is preferably designed modularly in that each individual stringer is detachable from, and attachable to, the transportation system, so that the number of stringers that is attached to the transportation system may be varied and can advantageously be chosen in dependence on the particular application of the apparatus of the invention.

Each stringer preferably includes a string buffer to park strings that have been formed by the particular stringer but that at the moment cannot be dispensed to the transportation system as their dispensing might cause a collision with strings formed and dispensed by other stringers in the transportation system.

There are preferentially one or more detection units provided for monitoring the strings in the transportation system and for detecting if and where strings are carried in the transportation system. A central detection unit in form of, e.g., a camera, in particular a 3D-camera, can be provided for monitoring all strings in the transportation system. There may also be an individual detection unit being allocated to each stringer, for example a camera that monitors the output of each stringer into the transportation system and/or a light barrier arranged transversely to the direction of flow of the transportation system and in the vicinity of the outlet of each stringer.

Furthermore, there is preferentially at least one control unit provided for controlling the dispensing of strings by the stringers, in particular in dependence on the output signals of the one or more detection units, so that collision between different strings can be avoided in the transportation system. There may be either one central control unit to which the one or more detection units transmit their output signals or there may be one control unit for each stringer.

According to method of the invention, apparatus of the invention is controlled such that no collisions occur in the transportation system between the strings that have been dispensed by the stringers into the transportation system. To avoid collision, each stringer can be allocated distinct time slots by the control unit (either by a central control unit or by an individual control unit assigned to the particular stringer) during which the stringer is allowed to dispense its strings into the transportation system. Alternatively or additionally, the stringers may be controlled by the central control unit or their individual control units in dependence on the output signals of the one or more detection units. That is, if the one or more detection units detect that there are strings from other stringers present in the transportation system, then a stringer is only allowed to dispense its strings into the transportation system if this would cause no collision with the strings already present in the transportation system.

According to a preferred version, the apparatus of the invention includes at least one encoding unit to place a code on each string, the code indicating the stringer by which the string has been formed. Each encoding unit can, e.g., include a laser for encoding in form of laser labeling. The strings are preferentially encoded on that side that is opposite to the side that faces the sun when the solar cell modules are put into operation, i.e. on their rear side. A log of the codes is kept so that, if the quality testing station detects a damaged string or if a string is found to be faulty later on during use, it can be traced back which stringer has formed the string in question.

Each stringer may be provided with its own encoding unit for encoding the strings produced by it. There may alternatively be a central encoding unit positioned preferably in the quality testing station for encoding the strings produced by all stringers. The central encoding unit obtains the information about the stringer that actually produced a particular string from a central control unit or from each individual stringer that informs the central encoding unit accordingly when it produces and/or dispenses a string. The solution with the central encoding unit is more cost-efficient.

Figure 2:
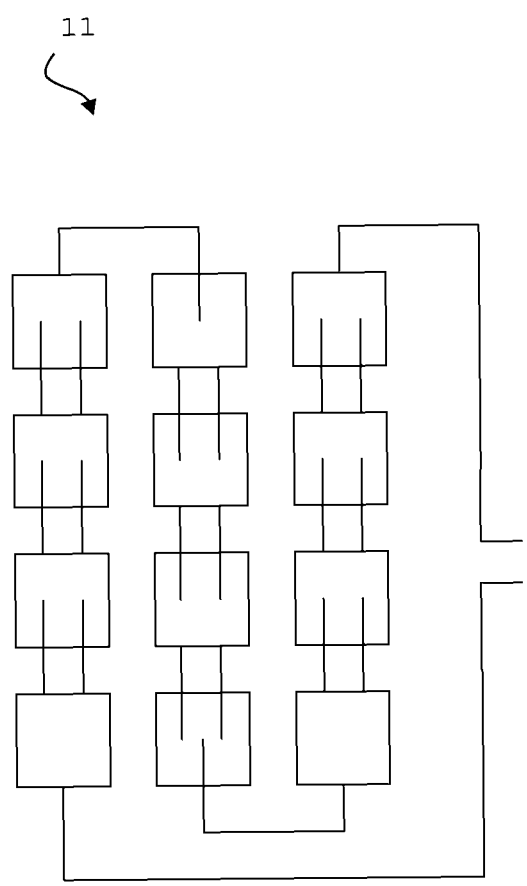

Further advantageous features and applications of the invention shall be found in the following description and the drawings illustrating the invention. In the drawings, like reference signs designate the same or similar parts throughout the several figures in which:

FIG. 1 schematically depicts a top view onto an apparatus according to the invention, and, FIG. 2 schematically depicts an exemplary solar cell matrix generated in the lay-up and interconnection station.

FIG. 1 depicts an apparatus 1 according to the invention that includes a number of stringers 2, a transportation system 3, a quality testing station 4 and a lay-up and interconnection station 5. The stringers 2 are detachably connected to the transportation system 3 The apparatus 1 is constructed modularly at least with respect to the stringers 2. Three stringers 2 are depicted as exemplary. However, less or more stringers 2 may be attached to the transportation system 3 which is indicated by the row of dots/ellipsis. The stringers 2 are preferably identical in construction.

The stringers 2 are arranged perpendicular to the direction of flow of the transportation system 3. They can be arranged on each of the longitudinal sides of the transportation system 3, with all stringers 2 being attached to the same longitudinal side or some stringers 2 being attached to one longitudinal side and some stringers 2 being attached to the opposite longitudinal side. In operation, the direction of flow of the stringers 2 is perpendicular to the direction of flow of the transportation system 3. This is indicated by the arrows on the transportation system 3 and on one of the stringers 2 in the sole figure. The direction of flow in the transportation system 3 preferably corresponds to the direction of flow in the quality testing station 4 and preferentially also to the direction of flow in the lay-up and interconnection station.

A central detection unit 12 (e.g., in form of a camera) is provided for detecting if and where strings are carried by the transportation system 3. The detection unit 12 preferably transfers its measurement signals as output signals to a central control unit 13. The central control unit 13 controls the several strings 2 such that collisions between strings from different stringers 2 can be avoided in the transportation system 3.

Each stringer 2 includes an operating panel 6 on that transverse side of the stringer 2 that faces away from the transportation system 3, with the stringer 2 being attached to the transportation system 3. The transverse side is usually the shorter side of a stringer 2. That is, the operating panel 6 is on the transverse side of the stringer 2 opposite to the transverse side of the stringer 2 that is attached to the transportation system 3. Hence, the operating panel 6 is arranged on the same end/side of the stringer 2 where the stringer 2 is supplied with raw material, e.g. solder ribbons and solar cells. By placing the operating panel 6 such, it can be easily reached by the staff even if the several stringers 2 are arranged close to each other.

Each stringer 2 includes a string buffer 7 at the end facing the transportation system when the stringer 2 is attached to the transportation system 3 (i.e., opposite to the end with the operating panel 6). The string buffer 7 serves for parking strings that have been formed by the particular stringer 2 but that at the moment cannot be dispensed to the transportation system 3, as their dispensing might cause a collision in the transportation system 3 with strings formed and dispensed by other stringers 2. Parking produced strings in the string buffers 7 is in particular necessary if the transportation speed/rate of the transportation system 3 is slower than the production speed/rate of the stringers 2.

The apparatus 1 according to the invention preferably includes a solar cell matrix buffer 9 that is arranged downstream of the lay-up and interconnection station 5. After the strings formed by the stringers 2 have been transferred by the transportation system 3 to the quality testing station 4, they are preferentially tested in the quality testing station 4 in particular for correct alignment and possible breakage. The quality testing station 4 preferably includes an encoding unit 14 that places a code on each string indicating which stringer 2 has formed that particular string. The central control unit 13 or/and the stringers 2 provide the encoding unit 14 with the required information about the origin of each string.

From the quality testing station 4, the strings are transferred to the lay-up and interconnection station 5 and therein aligned and turned, i.e. laid-up sun-side down, and laid-up in parallel next to each other upon a glass plate, wherein every second string is turned by 180 degrees in the plane spanned by its longitudinal and its transverse axis. The laid-up strings are then automatically interconnected to form a solar cell matrix with the solar cells being connected in series. FIG. 2 schematically depicts an exemplary solar cell matrix 11 formed in the lay-up and interconnection station 5.

From the lay-up and interconnection station 5, the solar cell matrices are transferred to a laminator 8 for lamination.

However, it might be that the operating speed of the laminator 8 is slower than the production speed of the solar cell matrices, i.e. the rate by which solar cells matrices can be processed by the laminator 8 might be lower than the rate by which the solar cell matrices leave the lay-up and interconnection station 5. To deal with this speed/rate difference, the solar cell matrix buffer 9 is provided downstream the lay-up and interconnection station 5. After leaving the lay-up and interconnection station 5 the solar cell matrices can be parked in the solar cell matrix buffer 9 until the laminator 8 is ready to process further solar cell matrices. The solar cell matrix buffer 9 serves also for parking solar cell matrices leaving the lay-up and interconnection station 5 which shall not be laminated. The solar cell matrix buffer 9 serves additionally also for parking solar cell strings leaving the lay-up and interconnection station 5 that have not been arranged in matrices. The dashed arrow between the solar cell matrix buffer 9 and the laminator 8 indicates that the transfer from the solar cell matrix buffer 9 preferably does not take place continuously, but only when the laminator 8 has capacity for further solar cell matrices.

The lay-up and interconnection station 5 of the apparatus 1 of the invention preferably has two outlets 10a, 10b, of which the first outlet 10a is directly connected to the laminator 8 and the second outlet 10b is connected with the solar cell matrix buffer 9. Through the first outlet 10a, the solar cell matrices are preferably transferred if there is no production speed/rate difference between the lay-up and interconnection station 5 and the laminator 8 or if the laminator 8 itself is provided with a solar cell matrix buffer (not shown). If the laminator 8 however works slower than the lay-up and interconnection station 5, then solar cell matrices are transferred via the second outlet 10b of the lay-up and interconnection station 5 to the solar cell matrix buffer 9 for parking. Which outlet 10a, 10b is used is controllable, in particular by the central control station, and depends on the production speed/rate difference with respect to the laminator 8.

What is claimed is:

1. Apparatus for manufacturing solar cell matrices comprising:
    a plurality of stringers configured to form strings from solar cells,
    a lay-up and interconnection station configured to arrange and interconnect solar cell strings into solar cell matrix;
    a transportation system configured to transfer strings from said stringers to said lay-up and interconnection station, said transportation system having a flow direction; and,
    said stringers being arranged either perpendicular to said flow direction of said transportation system, or alternatively, said stringers being arranged at an acute angle to an axis perpendicular to said flow direction of said transportation system.

2. The apparatus for manufacturing solar cell matrices as claimed in claim 1, wherein:
    said stringers are detachable from said transportation system; and,
    selectable numbers of stringers are attachable to said transportation system.

3. Apparatus for manufacturing solar cell matrices as claimed in claim 1, further comprising:
    a quality testing station configured to test solar cell strings is operatively connected to said transportation system.

4. Apparatus for manufacturing solar cell matrices as claimed in claim 3, further comprising:
    said flow direction of said transportation system corresponds to a flow direction of said quality testing station.

5. Apparatus for manufacturing solar cell matrices as claimed in claim 4, further comprising:
    said flow direction of said transportation system corresponds to a flow direction of said lay-up and interconnection station.

6. Apparatus for manufacturing solar cell matrices as claimed in claim 1, further comprising:
    a plurality of respective string buffers configured to park solar cell strings, said plurality of respective string buffers being included each respectively in a respective one of said plurality of stringers.

7. Apparatus for manufacturing solar cell matrices as claimed in claim 1, further comprising:
    a plurality of respective operating panels being included each respectively in a respective one of said plurality of stringers, each of said respective operating panels being arranged on the respective stringer's respective transverse side facing away from said transportation system when attached thereto.

8. Apparatus for manufacturing solar cell matrices as claimed in claim 1, further comprising:
    at least one detection unit configured to detect if and where strings are carried by said transportation system.

9. Apparatus for manufacturing solar cell matrices as claimed in claim 8, further comprising:
    at least one camera included in said at least one detection unit.

10. Apparatus for manufacturing solar cell matrices as claimed in claim 8, further comprising:
    at least one light barrier included in said at least one detection unit.

11. Apparatus for manufacturing solar cell matrices as claimed in claim 8, further comprising:
    at least one control unit configured to control said stringers to avoid collisions between solar cell strings.

12. Apparatus for manufacturing solar cell matrices as claimed in claim 1, further comprising:
    a solar cell matrix buffer configured to park solar cell matrices leaving said lay-up and interconnection station, said solar cell matrix buffer being operatively connected downstream of said lay-up and interconnection station; and,
    a laminator, said laminator being operatively connected to an outlet of said solar cell matrix buffer.

13. Apparatus for manufacturing solar cell matrices as claimed in claim 12, further comprising:
    a first outlet of said lay-up and interconnection station, said first outlet adapted for direct connection to said laminator;
    a second outlet of said lay-up and interconnection station, said second outlet adapted for direct connection with said solar cell matrix buffer; and,
    a control unit configured to control dispensing of solar cell matrices through said first and second outlets.

14. Apparatus for manufacturing solar cell matrices as claimed in claim 1, further comprising:
    at least one encoding unit configured to place code on a solar cell string to indicate which of said plurality of stringers formed the coded solar cell string.

15. Apparatus for manufacturing solar cell matrices as claimed in claim 14, further comprising:
    a quality testing station configured to test solar cell strings is operatively connected to said transportation system, said at least one encoding unit being arranged in said quality testing station.

16. Apparatus for manufacturing solar cell matrices as claimed in claim 14, further comprising:
    a plurality of encoding units, each respective encoding unit of said plurality of encoding units being located in a respective one of said plurality of stringers.

17. A process for manufacturing solar cell matrices, comprising the steps of:
    forming strings from solar cells in a plurality of stringers;
    interconnecting the solar cell strings in a lay-up and interconnection station;
    transferring strings from the plurality of stringers to the lay-up and interconnection station via a transportation system;
    providing the plurality of stringers in an arrangement either at perpendicular to the transportation flow direction, or alternatively, at an acute angle to an axis perpendicular to the transportation flow direction; and, controlling the plurality of stringers to avoid collisions between solar cell strings in the transportation system.

18. A process for manufacturing solar cell matrices as claimed in claim 17 further comprising the step of:
    allocating to each respective stringer of the plurality of stringers respective distinct time slots for dispensing its respective solar cell strings to the transportation system.

19. A process for manufacturing solar cell matrices as claimed in claim 18 further comprising the steps of:
    monitoring the presence of solar cell strings in the transportation system; and,
    controlling dispensing of solar cell strings from a respective one of the plurality of stringers in dependence on the presence, in the transportation system, of solar cell strings formed by stringers other than the respective one of the plurality of stringers.

* * * * *